United States Patent [19]

McDaniel

[11] Patent Number: 5,180,988
[45] Date of Patent: Jan. 19, 1993

[54] RESISTORLESS TRIM AMPLIFIER USING MOS DEVICES FOR FEEDBACK ELEMENTS

[75] Inventor: Bart R. McDaniel, Phoenix, Ariz.

[73] Assignee: Intel Corporation, Santa Clara, Calif.

[21] Appl. No.: 816,153

[22] Filed: Dec. 31, 1991

[51] Int. Cl.⁵ ............................................. H03G 3/12
[52] U.S. Cl. .................................. 330/282; 330/86; 307/296.8
[58] Field of Search .................... 330/282, 785, 86; 307/296.8

[56] References Cited

U.S. PATENT DOCUMENTS

| | | | |
|---|---|---|---|
| 4,100,437 | 7/1978 | Hoff | 330/282 |
| 4,451,795 | 5/1984 | Kilian | 330/282 |
| 4,500,845 | 2/1985 | Ehni | 330/282 |
| 4,994,688 | 2/1991 | Horiguchi et al. | 307/296.8 |

FOREIGN PATENT DOCUMENTS

| | | | |
|---|---|---|---|
| 58-64812 | 4/1983 | Japan | 330/282 |
| 1252013 | 6/1989 | Japan | 330/282 |

Primary Examiner—Paul M. Dzierzynski
Assistant Examiner—Tan Dinh
Attorney, Agent, or Firm—Blakely, Sokoloff, Taylor & Zafman

[57] ABSTRACT

A MOS voltage trim amplifier which can multiply an input voltage with a quantized value to generate an output voltage. The MOS trim amplifier comprises a MOS op-amp, a multiplying feedback network, a gate-bias network and startup circuit. The MOS op-amp has a noninverting terminal for receiving the input and an inverting terminal for receiving the feedback network. The multiplying feed back network uses two MOSFETs as feedback elements to provide the voltage ratio for the multiplication. The gate-bias network provides a reference voltage which is a fraction of the input voltage through a MOSFET voltage divider to the feedback MOSFETs. Current mirrors are employed in the gate-bias network to provide a constant stable current through the MOSFET voltage divider to avoid loading the input. The startup circuit generates a bias current to the two feedback MOSFETs to drive them out of their natural off state.

8 Claims, 2 Drawing Sheets

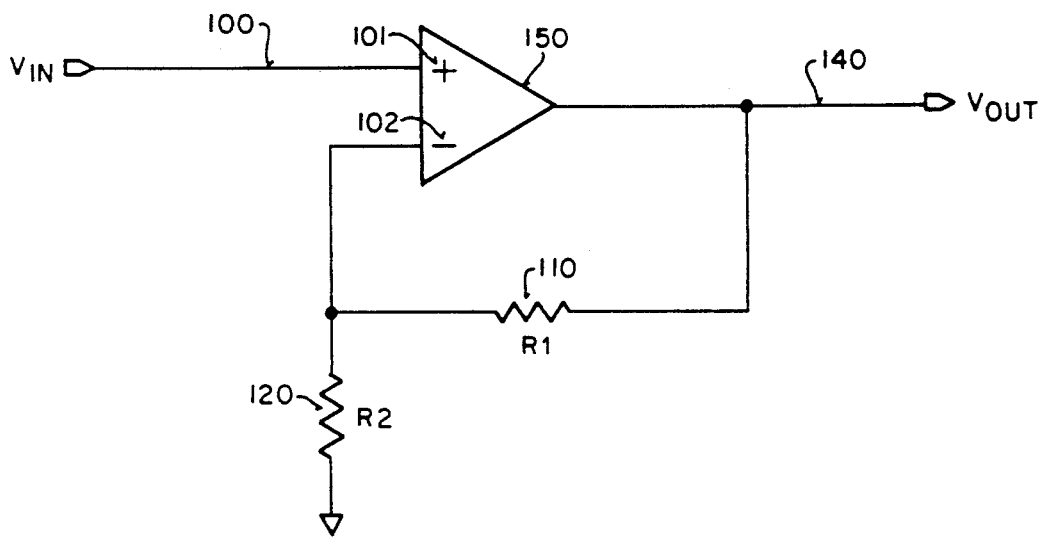
FIG_1 (PRIOR ART)
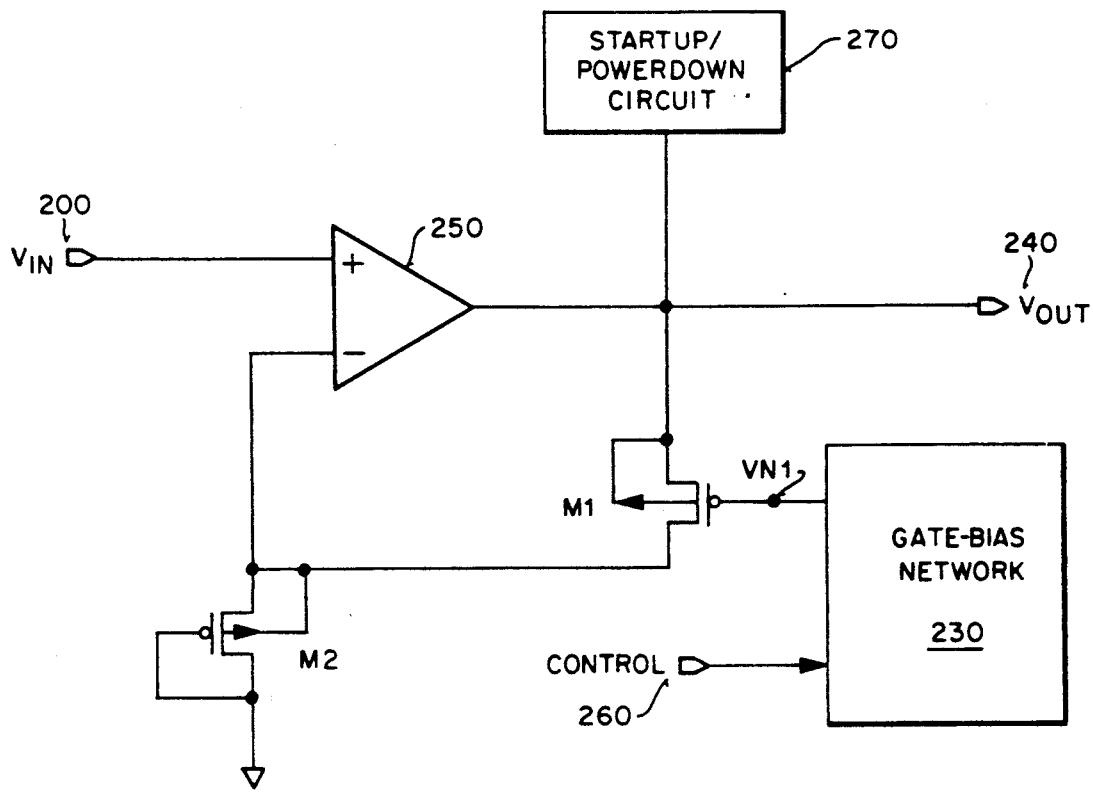
FIG_2

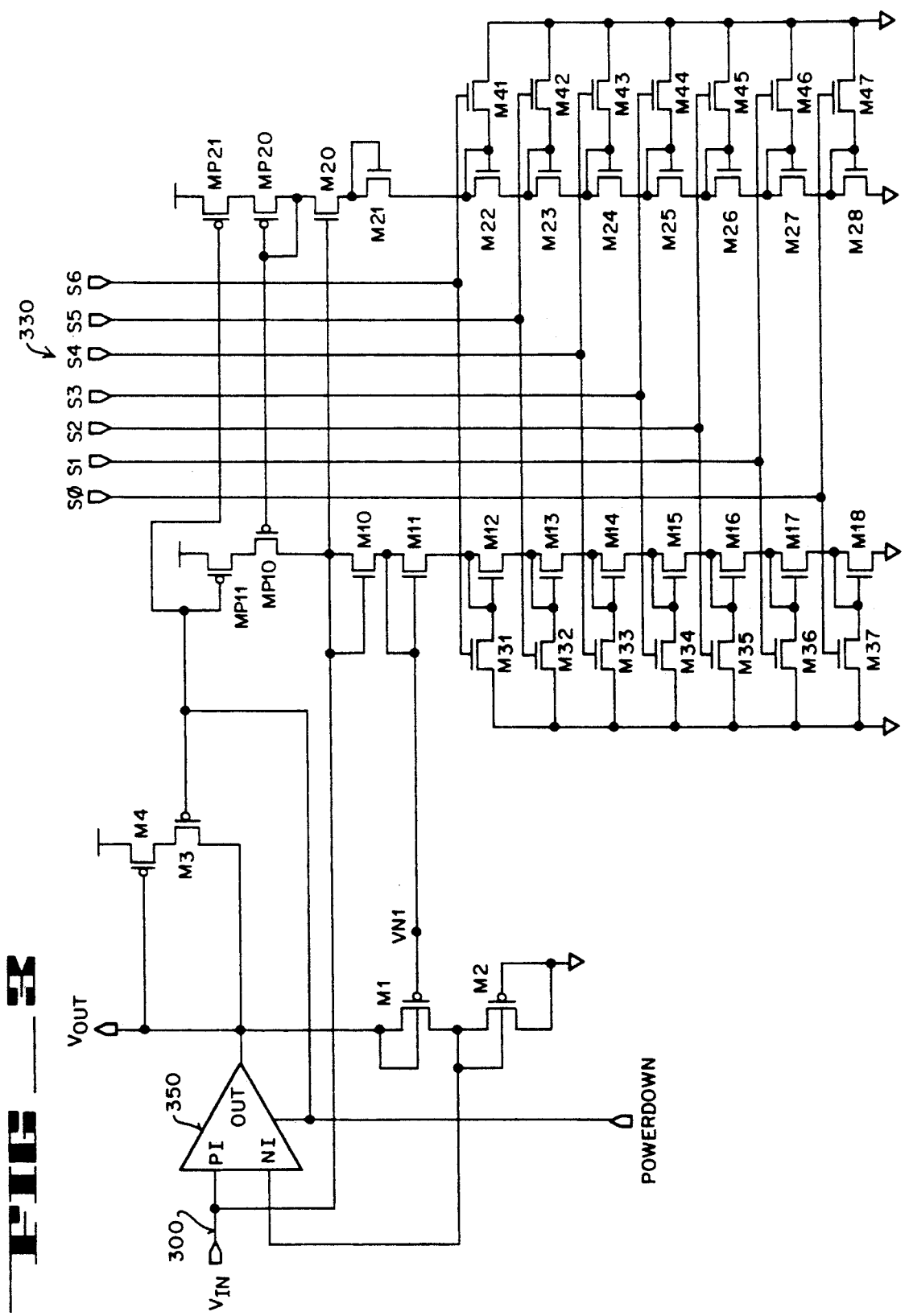
FIG_3

RESISTORLESS TRIM AMPLIFIER USING MOS DEVICES FOR FEEDBACK ELEMENTS

BACKGROUND OF THE INVENTION

1. Field of the Invention

The present invention is related to voltage trim amplifiers used in programmable memory devices and specifically to integrated voltage trim amplifiers with MOS feedback elements.

2. Art Background

In the field of programmable memory devices it is common to maintain high voltage regulation by using a feedback amplifier configuration to provide multiplication of an input voltage by quantized values. The multiplying feedback network typically works with an operational amplifier ("op-amp") as the active gain element and accomplishes the function through a conventional resistor network as shown in FIG. 1. Referring to FIG. 1, the voltage-series feedback amplifier comprises an op-amp 150 having a non-inverting terminal 101 for input voltages and an inverting terminal 102 for the feedback voltage.

To help describe the present invention, the theory of the feedback amplifier is discussed as follows. Because the potentials of the two input terminals to a high gain op-amp are virtually identical, the gain of this amplifier configuration can be expressed as:

$$GAIN = Vout/Vin = Vout/VR2 = (R1+R2)/R2;$$

Therefore, $$Vout = Vin*(1+R1/R2). \quad \text{(Equation 1)}$$

As shown in the equation, the gain of the amplifier can be made variable by varying the ratio of the feedback resistors. This variability is quite useful in the art of programmable memory products in that the output voltage from the amplifier could be made dependent upon the ratioed resistance of the feedback network. However, there are problems associated with using resistors in the integrated circuit devices. First, in advanced CMOS processes, high value quality resistors are hard to come by. Secondly, resistors in a monolithic integrated circuit take up much more area in the silicon than MOSFETs. Also, practical resistors cannot operate at very high impedance to enable the circuit to run on reduced currents. Further, the resistors are not stable over process and temperature parameters.

As will be described in the following, the present invention is an amplifier feedback circuit where the entire circuit can realized using MOS devices, a feature that is compatible with the advanced CMOS processes nowadays. Also, by using MOS devices the silicon usage is greatly reduced as opposed to the integrated resistors. The feedback transistors in the amplifier of the present invention can potentially operate at very high impedance compared to what is practical with resistors. Therefore, the output impedance of the op-amp can be made higher and the entire circuit can be run on reduced currents.

SUMMARY OF THE INVENTION

Therefore, it is an object of the present invention to provide a voltage trim amplifier which can multiply an input voltage with a quantized value to generate an output voltage.

It is another object of the present invention to be able to alter the quantized value to generate an output voltage with a different multiplication factor.

It is another object of the present invention to provide a trim amplifier capable of fabrication using the MOS processes.

It is further an object of the present invention to provide the functionality of feedback elements using MOS devices.

The present invention discloses a MOS voltage trim amplifier which can multiply an input voltage with a quantized value to generate an output voltage. The MOS trim amplifier comprises a MOS op-amp, a multiplying feedback network, a gate-bias network and startup circuit. The MOS op-amp has a noninverting terminal for receiving the input and an inverting terminal for receiving the feedback network. The multiplying feedback network uses two MOSFETs as feedback elements to provide the voltage ratio for the multiplication. The gate-bias network provides a reference voltage which is a fraction of the input voltage through a MOSFET voltage divider to the feedback MOSFETs. Current mirrors are employed in the gate-bias network to provide a constant stable current through the MOSFET voltage divider to avoid loading the input. The startup circuit generates a bias current to the two feedback MOSFETs to drive them out of their natural off state.

BRIEF DESCRIPTION OF THE DRAWINGS

Additional objects, features and advantages of the present invention will become apparent from the following description of the invention, wherein:

FIG. 1 is a schematic diagram illustrating the conventional op-amp with resistor feedback elements.

FIG. 2 is a block diagram illustrating the trim amplifier of the present invention.

FIG. 3 is a schematic diagram illustrating the MOS trim amplifier incorporating the teachings of the present invention.

DETAILED DESCRIPTION OF THE INVENTION

The present invention discloses a MOS trim amplifier using MOSFET devices to generate an output which is an input voltage multiplied by a quantized value. In the following description, numerous specific details are set forth such as voltages, currents, device types, etc., in order to provide a thorough understanding of the present invention. It will be obvious, however, to one skilled in the art that these details are not required to practice the present invention. In other instances, well-known circuits, methods and the like are not set forth in detail in order to avoid unnecessarily obscuring the present invention.

With reference to FIG. 2, a simplified block diagram of the trim amplifier of the present invention is shown. Voltage Vin 200 is applied to the non-inverting terminal of op-amp 250. Connecting to the inverting terminal of op-amp 250 is the drain of p-channel MOSFET M1 and the source of p channel MOSFET M2. The body of Vp-channel MOSFET M1 is connected to its own source, which is connected to the output node 240 and the start-up/power-down circuit 270. The body of p-channel MOSFET M2 is connected to its own source while the gate is grounded with its drain. A gate bias network 230 is connected to the gate of p-channels MOSFET M1 to provide variable voltage values to the gate to control the multiplication ratio of feedback network comprising p-channel MOSFETs M1 and M2.

The operation of the circuit in FIG. 2 is described as follows. When p-channel MOSFETs M1 and M2 are operating in saturation mode, the geometrically identical M1 and M2 devices will bias with identical body effects and a very high drain resistance. Assuming the gain of op-amp 250 is very high so that input current is zero, the output current equation can be written as:

Since $Ids\_M1 - Ids\_M2 = 0$, $Ids\_M1 = Ids\_M2$,

Assuming saturation mode, thus $K_2{'}*W_2/L_2(Vin - Vt)^2 = K_1{'}*W_1/L_1(V_{n1} - V_{out} - V_t)^2$.

Since $W_1 = W_2$, $L_1 = L_2$, $K_1{'} = K_2{'}$, $Vout = Vin + Vn1$.  (Equation 2)

Referring to Equation 2, it will be appreciated that if the voltage Vn1 provided by the gate biased network 230 can be a constant R multiplied by the voltage Vin, Equation 2 becomes: $Vout = Vin*(1+R)$. It should be noted that a saturation criterion must hold for p-channel MOSFETs M1 and M2 to operate the feedback circuit, which is $(Vgs - Vt) \leq Vds$. To avoid going over the edge of saturation, it should be apparent to those skilled in the art that Vin should not be lower than 1.2 volts. If $Vin = 1.2$ volts and $Vt(M1) = -0.6$ volts, then $Vn1 = 0.6$ volts and will be at the edge of saturation which is the lowest practical limit of the operation.

To vary the effective resistance value in the feedback network, gate bias network 230 is used to vary the gate potential of p-channel MOSFET M1. The start-up/power-down circuit 270 is used to start-up the MOS network because MOS devices in a self-biasing configuration are not unconditionally guaranteed to start up from an off state. The circuit 270 achieves the start up function by providing a small bias current to the MOS devices so that the output voltages of the MOS devices are raised to prevent them from biasing themselves off.

Reference is now made to FIG. 3, where a schematic diagram of the preferred embodiment of the present invention is shown. As shown in FIG. 3, voltage Vin is connected to the non-inverting terminal of op-amp 350. Voltage Vin is also coupled to the gate bias network 330 at the gate and source connection of n-channel MOSFET M10 as a constant stable voltage source. As shown in FIG. 3, the gate bias network 330 comprises two stacks of MOSFETs. The left-hand stack comprises series-connected MOSFETs MP11, MP10, and M10-M18, where MOSFETs M10-M18 are native threshold n-channel devices having identical geometries. It should be noted that a native threshold n-channel device is one with a threshold close to zero volts as opposed to the standard n-channels with higher threshold voltages. The n-channel MOSFETs M10-M18 are also source-gate connected so that each one of them can act like a resistive device. The n-channel MOSFETs M31-M37 are connected between the corresponding stack of MOSFETs M12-M18 and the ground as shorting resistors which will effectively short the corresponding native threshold n-channel device out of the stack. As shown in FIG. 3, the right-hand stack of the gate bias network 330 is constructed in a mirrored image of the left-hand stack using devices MP21, MP20, M20-M28 and M41-M47 for generating a load current through device MP10 which will bias the stack comprising devices M10 through M18 without loading the input voltage source at Vin. The current mirror feedback loop comprises device M10 mirroring device M20 and MP20 mirroring MP10. The p-channel devices MP11 and MP21 are used as power-down devices for the stacks. The p-channel devices M3 and M4 serve to power down and start up the stacks. Device M3 serves to power down the feedback MOSFETs M1 and M2, while the device M4 provides a bias current to start up the feedback MOSFETs M1 and M2. The power down and start up mechanism should be appreciated by those skilled in the art because the feedback MOSFETs M1 and M2 in conjunction with the op-amp 350 do not tend to start up without a bias current due to their MOS characteristics.

With reference still made to FIG. 3, the control lines S0–S6 are the encoding lines to short out or to control the gates of the shorting devices M31 through M37 and M41 through M47. By activating the shorting device at each level, the control line is able to take the n-channel MOSFET out of the stack to generate a voltage level at VN1 which is a fraction of Vin through the stack of MOSFETs M10-M18.

The operation of the trim amplifier of the present invention is described as follows. By using the control lines S0–S6, the devices M31-M37 can selectively short out MOSFETs M12-M18, beginning at the bottom of the stack. Shorting these devices M12-M18 gives the voltage Vn1 the following fractions of Vin:

| | |
|---|---|
| Full Stack (no shortage) | Vn1 = 8/9 Vin |
| M18 shorted | Vn1 = ⅞ Vin |
| M17 shorted | Vn1 = 6/7 Vin |
| M16 shorted | Vn1 = 5/6 Vin |
| M15 shorted | Vn1 = 4/5 Vin |
| M14 shorted | Vn1 = ¾ Vin |
| M13 shorted | Vn1 = ⅔ Vin |
| M12 shorted | Vn1 = ½ Vin |

These ratios will hold true while devices M10–M18 are constructed to have identical dimensions. However, in the current implementation there will be some threshold voltage shifting among these devices due to the non-identical body biasing. However, the voltage across the stack is kept nominally low at 1.25 volts and the body effect of the native threshold devices is much less than the implanted-channel enhancement devices.

For a 1.0 micron CMOS process with $Vin = 1.20$ volts, the value of Vout is expressed in Table 1.

TABLE 1

| 0° C. | | 25° C. | | 100° C. | | Ideal |
|---|---|---|---|---|---|---|
| Vcc = 3v | Vcc = 5v | Vcc = 3v | Vcc = 5v | Vcc = 3v | Vcc = 5v | |
| 2.260v | 2.256v | 2.265v | 2.267v | 2.264v | 2.271v | 2.267v |
| 2.244v | 2.242v | 2.248v | 2.248b | 2.248v | 2.253v | 2.250v |
| 2.222v | 2.220v | 2.227v | 2.227v | 2.227v | 2.232v | 2.229v |
| 2.195v | 2.193v | 2.199v | 2.201v | 2.199v | 2.206v | 2.200v |
| 2.157v | 2.156v | 2.160v | 2.163v | 2.161v | 2.172v | 2.160v |

TABLE 1-continued

| 0° C. | | 25° C. | | 100° C. | | Ideal |
|---|---|---|---|---|---|---|
| 2.098v | 2.100v | 2.102v | 2.108v | 2.103v | 2.110v | 2.100v |
| 2.003v | 2.007v | 2.010v | 2.013v | 2.008v | 2.007v | 2.000v |
| 1.810v | 1.824v | 1.822v | 1.833v | 1.823v | 1.838v | 1.800v |

As can be seen in Table 1, the trim amplifier of the present invention is first order power supply and temperature stable.

Although the trim amplifier shown in FIG. 3 comprises only 8 native threshold n channel devices, it should be apparent to those skilled in the art that a different number of devices can be stacked up to have a different voltage dividing while conduction is maintained through the stack of devices. Also, the sizes of the devices M12-M18 can be adjusted so the ratios can be made geometrically progressive through a series of linear steps.

I claim:

1. A MOS trim amplifier circuit for providing multiplication of an input voltage by a quantized value, comprising:

an op-amp having a noninverting terminal for receiving an input voltage, an inverting terminal, and an output terminal for generating an output voltage, said output voltage being said input voltage times a quantized value;

multiplying feedback means coupled between said inverting terminal and said output terminal of said op-amp for providing a feedback voltage to said inverting terminal in response to a reference voltage such that said output voltage equals said input voltage times said quantized value, said quantized value being equal to (1+(reference voltage/input voltage));

gate bias means comprising a plurality of shorting MOSFETs and serially connected MOSFETs coupled to said multiplying feedback means for voltage-dividing said input voltage to generate said reference voltage such that said reference voltage is a fraction of said input voltage, each of said serially connected MOSFETs having its gate coupled to ground through a source/drain current path of each of said shorting MOSFETs, said input voltage being voltage-divided by selectively shorting over a predetermined number of said serially connected MOSFETs to ground through their corresponding shorting MOSFETs;

control means coupled to said gate bias means for selectively causing said predetermined number of said serially connected MOSFETs to short over to ground, said control means coupled to the gate of each of said shorting MOSFETs of said gate bias means to control said source/drain current path of each of said shorting MOSFETs.

2. A MOS amplifier according to claim 1, further comprising:

startup means coupled to said output terminal of said op-amp and said multiplying feedback means for providing a start up bias current to said multiplying feedback means.

3. A trim amplifier according to claim 2, further comprising current mirrors means coupled to said gate bias mean to provide a current source such that said gate bias means does not load down said input voltage.

4. A trim amplifier according to claim 2, wherein said multiplying feedback means comprises:

first p-channel MOSFET coupled to said output terminal of said MOS op-amp having its drain and body coupled to said output terminal, the gate of said first MOSFET being coupled to said gate bias means to receive said reference voltage, said first MOSFET operating in saturation;

second p-channel MOSFET coupled to said inverting terminal of said op-amp having its drain and body coupled to said inverting terminal, the drain and body of said second MOSFET also coupled to the source of said first MOSFET, the source of said second MOSFET being coupled to ground, said second MOSFET operating in saturation.

5. A trim amplifier circuit for providing multiplication of an input voltage by a plurality of quantized values, comprising:

a MOS op-amp having a noninverting terminal for receiving said input voltage, a inverting terminal, and an output terminal for generating an output voltage, said output voltage being equal to said input voltage times a quantized value;

first p-channel MOSFET coupled to said output terminal of said MOS op-amp having its drain and body coupled to said output terminal, the gate of said first MOSFET being coupled to receive a reference voltage such that said quantized value being equal to (1+reference voltage/input voltage), said first MOSFET operating in saturation;

second p-channel MOSFET coupled to said inverting terminal of said op-amp having its drain and body coupled to said inverting terminal, the drain and body of said second MOSFET also coupled to the source of said first MOSFET, the source of said second MOSFET being coupled to ground, said second MOSFET operating in saturation;

gate bias network coupled to said first p-channel MOSFET at its gate and to said noninverting terminal of said MOS op-amp for providing said reference voltage to said first p-channel MOSFET, said gate bias network comprising;

a plurality of native-threshold n-channel MOSFETs for voltage-dividing said input voltage to generate said reference voltage to the gate of said first p-channel MOSFET, said reference voltage being a fraction of said input voltage, each of said native-threshold n-channel MOSFETs having its drain coupled to its gate;

a plurality of shorting MOSFETs coupled to said native-threshold n-channel MOSFETs, each of said shorting MOSFETs coupling between the gate of a corresponding native-threshold n-channel MOSFET and ground, each of said shorting MOSFETs pulling the drain of its corresponding native-threshold n-channel MOSFET to ground when said shorting MOSFET turns on;

a plurality of current mirrors coupled to said native-threshold n-channel MOSFETs and said shorting MOSFETs, said current mirrors generating a load current through said native-threshold n-channel MOSFETs to avoid loading said input voltage source;

control means coupled to said shorting MOSFETs for turning on predetermined number of said shorting MOSFETs to pull its corresponding native-threshold n-channel MOSFET to ground;

powerdown means coupled to said native-threshold n-channel MOSFETs and to said current mirrors to provide power down.

6. A trim amplifier circuit according to claim 5, wherein said powerdown means is a p-channel MOSFET coupling between the power supply and said plurality of current mirrors.

7. A trim amplifier circuit according to claim 5, further comprising:

a startup bias MOSFET for providing a bias current to said first and second p-channel MOSFETs, said startup bias MOSFET coupling its gate to said output terminal of said MOS op-amp and its drain to power supply;

a power-down MOSFET for powering down said first and second p-channel MOSFET, said power-down MOSFET coupling its gate to said power-down means, its drain to the source of said startup bias MOSFET and its source to the output terminal of said MOS op-amp.

8. A trim amplifier circuit according to claim 5, wherein said native threshold n-channel MOSFETs comprise 9 serially connected MOSFETs and said control means shorts out at most 8 MOSFETs such that said reference voltage varies from $\frac{1}{2}$ to 8/9 of said input voltage.

* * * * *